(12) United States Patent
Koh et al.

(10) Patent No.: US 6,319,326 B1
(45) Date of Patent: Nov. 20, 2001

(54) APPARATUS FOR SURFACE MODIFICATION OF POLYMER, METAL AND CERAMIC MATERIALS USING ION BEAM

(75) Inventors: Seok-Keun Koh; Hyung Jin Jung; Won Kook Choi; Jung Cho, all of Seoul (KR)

(73) Assignee: Korea Institute of Science and Technology, Seoul (TW)

( * ) Notice: Subject to any disclaimer, the term of this patent is extended or adjusted under 35 U.S.C. 154(b) by 0 days.

(21) Appl. No.: 09/555,832

(22) PCT Filed: Dec. 4, 1998

(86) PCT No.: PCT/KR98/00403

§ 371 Date: Aug. 7, 2000

§ 102(e) Date: Aug. 7, 2000

(87) PCT Pub. No.: WO99/29922

PCT Pub. Date: Jun. 17, 1999

(30) Foreign Application Priority Data

Dec. 5, 1997 (KR) .................................................. 97-66184

(51) Int. Cl.$^7$ .............................. C23C 16/00; H05H 1/00
(52) U.S. Cl. ..................... 118/718; 118/719; 118/723 FI; 118/723 EB
(58) Field of Search ............................ 118/723 EB, 718, 118/719, 723 FI, 723 FE, 729, 723 MP, 723 VE, 720, 715, 716; 156/345

(56) References Cited

U.S. PATENT DOCUMENTS

| | | | | |
|---|---|---|---|---|
| 4,466,258 | * | 8/1984 | Sando et al. | 68/5 C |
| 4,687,939 | * | 8/1987 | Miyauchi et al. | 250/492.2 |
| 4,889,609 | * | 12/1989 | Cannella | 204/298.35 |
| 5,529,631 | * | 6/1996 | Yoshikawa et al. | 118/718 |

FOREIGN PATENT DOCUMENTS

| | | | |
|---|---|---|---|
| 0 141 417 | | 5/1985 | (EP) . |
| 2-149661-A | * | 6/1990 | (JP) ............ C23C/14/02 |
| 1-230774-A | * | 9/1989 | (JP) ............ C23C/14/54 |
| 9-91667-A | * | 4/1997 | (JP) ............ G11B/5/66 |

* cited by examiner

Primary Examiner—Gregory Mills
Assistant Examiner—P. Hassanzadeh
(74) Attorney, Agent, or Firm—Darby & Darby

(57) ABSTRACT

An apparatus for surface modification of a polymer, metal, and ceramic material using an ion beam (IB) is disclosed, which is capable of supplying and controlling a voltage (220) applied to a material to be surface-modified so that an ion beam (IB) energy irradiated to the material is controlled, the degree of the vacuum of a reaction gas in a portion of a vacuum chamber in which the ion beam is irradiated is differentiated from that in a portion in which the ion beam is generated, and both-side irradiating processing and continuous processing is applicable.

8 Claims, 8 Drawing Sheets

APPARATUS FOR SURFACE MODIFICATION OF POLYMER, METAL AND CERAMIC MATERIALS USING ION BEAM

TECHNICAL FIELD

The present invention relates to an apparatus for surface modification of polymer, metal and ceramic materials using an ion beam, and in particular to an improved apparatus for surface modification of polymer, metal and ceramic materials using an ion beam which is capable of controlling the amount of a reaction gas and the energy of an ion beam, modifying the surface of a powder material and implementing a continuous surface modification of a material.

BACKGROUND ART

Conventional ion beam modification methods include methods based on a thin film fabrication and methods based on a surface cleaning process.

As the thin film fabrication methods, there are proposed an ion implantation using a high energy (tens of KeV to a few MeV), an ion beam irradiation, an ion beam sputtering deposition which is implemented by irradiating ionized particles from an ion source generating low energy (0 to a few KeV) particles onto a target for thereby generating a material to be deposited, a multiple ion beam deposition, a process for assisting a thin film fabrication, and an ion-assisted deposition.

In addition, as the surface cleaning methods, there are proposed a surface cleaning which is generated by irradiating energized particles onto the surface of a material and a reactive ion beam etching which is implemented by supplying a reaction gas into a vacuum chamber.

In case of the thin film fabrication using an ion beam, the thin film is fabricated by controlling the relative ratio of the particles between the to-be deposited particles and the assisted ion beam particles. In the case of the cleaning method using the ion beam, a reaction gas is ionized while controlling the occurrence of a plasma and the amount of the reaction gas, thereby implementing a quick surface cleaning, while the cleaning of the conventional wet reaction requires a long time.

FIG. 1 is a schematic view illustrating an earlier-filed (Korean Patent Applns. Nos. 2465/1996, 11994/1996, 11995/1996 and 11996/1196, the disclosures of which are incorporated hereinto by reference) surface modification apparatus which includes an ion source 10 having an ion gun 12 generating an ion beam IB and an assisted ion gun 14 generating an assisted ion beam AB, an ion beam current measuring unit 40 and controller 42 for respectively measuring and controlling the amount of irradiated energized ions, a sample holder 20 holding a sample material 22 the surface of which is to be modified by ions, a reaction gas control apparatus (not shown) having a reaction gas inlet 26 providing therethrough a reaction gas to the sample material 22, a vacuum pump 28 generating a vacuum within an enclosing vacuum chamber 30 in order to facilitate the generation of the ion beams IB, AB.

The apparatus may be implemented in the following ways. First, oxygen is provided as a reaction gas around a polymer material, and argon ions are irradiated onto the surface of the material, thereby generating a hydrophilic functional group, in which an oxygen atom is chemically bonded with a carbon ring, on the surface of the polymer material. In addition, the argon ions are irradiated together with providing the oxygen to the surface of an aluminum nitride AlN, thereby forming a bonding of the AlON and a new material on the surface without affecting the material itself. Accordingly, various problems can be solved due to the variation of inherent properties of surfaces. For example, the adhesion of another material, adsorption, hydrophilic property with water, and surface strength of the material may be changed. In the ion beam assisted reaction, the particle energy having a lower energy band is generally used compared to the earlier deposition methods, and the amount of the ion irradiation is $10^{13}$–$10^{18}$ ions/cm$^2$, and the amount of the reaction gas is also characterized in that the partial pressure around the material is higher than the total degree of vacuum in the vacuum chamber.

However, in the above-described ion beam irradiating apparatus, only the surface modification by the reaction gas is considered as an important matter. Therefore, the improvement of physical properties and the surface modification characteristic cannot have been obtained by controlling the amount of the reaction gas. Also, the energy of the ion beam applied to a sample material has been controlled by only the ion beam.

DISCLOSURE OF THE INVENTION

Accordingly, it is an object of the present invention to provide an apparatus for surface modification of polymer, metal and ceramic materials using an ion beam which overcomes the aforementioned problems encountered in the background art.

It is another object of the present invention to provide an apparatus which is capable of controlling the amount of a reaction gas provided to the surface being modified while irradiating a specific amount of ion beam energy onto the surface of a material to be surface-modified, and controlling the ion energy of an ion beam applied to the surface, thereby forming a material on the surface which has a new chemical structure, whereby the degree of the surface modification is controlled by controlling the ion irradiation amount, the implanting amount of reaction gases and the particle energy of energized particles.

It is another object of the present invention to provide an apparatus for surface modification which can be applied to both-face irradiating type and continuous batch type processes in actual manufacturing.

To achieve the above objects, there is provided an apparatus for surface modification of polymer, metal and ceramic materials using an ion beam according to the present invention which includes a chamber, a means for maintaining a vacuum within the chamber, an ion source having an ion gun for generating an ion beam, a holder on which a material to be surface-modified may be placed to be irradiated by the ion beam from the ion source, and a reaction gas supplying means for supplying a reaction gas to the material surface therethrough, wherein a voltage is applied to the holder while insulating the holder from the chamber, whereby an ion energy of the ion beam which is irradiated to the material surface is controlled.

To achieve the above objects, there is also provided an apparatus for surface modification of polymer, metal and ceramic materials using an ion beam according to the present invention which includes a chamber, a means for maintaining a vacuum within the chamber, an ion source having an ion gun for generating an ion beam, a holder on which a material to be surface-modified may be placed to be irradiated by the ion beam from the ion source, a reaction gas supplying means for supplying a reaction gas to the material surface therethrough, and a separating means for separating a material reaction portion of the chamber in which the surface is modified when the reaction gas is supplied to the material surface, from a portion of chamber in which the ion source is provided, wherein the vacuum level in the material reaction portion of the chamber is maintained to be higher than that in the portion of the chamber in which the ion source is provided.

To achieve the above objects, there is further provided an apparatus for surface modification of polymer, metal and ceramic materials using an ion beam according to the present invention which includes a chamber, a vacuum means for maintaining a vacuum within the chamber, an ion source having an ion gun for generating an ion beam, which is installed in an upper portion of the chamber, a holder for holding a powdered material to which an ion beam from the ion source is irradiated while agitating the powdered material, and a reaction gas supplying means for supplying a reaction gas to the powdered material therethrough.

To achieve the above objects, there is still further provided an apparatus for surface modification of polymer, metal and ceramic materials using an ion beam according to the present invention which includes a chamber, a vacuum means for maintaining a vacuum within the chamber, one or more ion sources each having an ion gun and provided in an upper or lower portion of the chamber, or in at least two respective opposing locations within the chamber for generating respective ion beams and irradiating the ion beams respectively to front and/or back, or opposing, surfaces of a material to be surface-modified, a means for supplying the material to be surface-modified, and a reaction gas supplying means for supplying a reaction gas to respective surfaces of the material onto which the ion beams generated from the ion sources are irradiated, wherein the material is continuously supplied to a reaction region in the chamber over which the ion beams are irradiated, and drawn off from the reaction region.

Here, the material to be surface-modified may be wound in a roll, one end of the material being unwound at one side of the chamber to be supplied into the reaction region, and the part of the material supplied into the reaction region is surface-modified by irradiating the ion beams thereon, and then the modified material is wound again in the other side of the chamber. Also, the material may be supplied and drawn off as wafers.

Furthermore, a plurality of vacuum means may be provided in the chamber, and such vacuum means are provided in due sequence so that the degree of vacuum in the chamber is the highest in the reaction region when the material to be surface-modified is supplied from the outside of the reaction chamber to the reaction region and the material having been surface-modified is drawn off to the outside of the chamber.

A Kaufman type ion source, a cold hollow cathode ion source, or a high frequency ion source, etc. may be used as the ion source. Hereinafter, the energized particles generated from the ion source are referred to as an ion beam. The amount of the irradiated ions is preferably within the range of $10^{13}$ to $10^{18}$ ions/cm$^2$. The amount of the reaction gas blown on the material to be modified surface is preferably 0 to 30 ml/min. The partial pressure of the reaction gas in the reaction chamber is higher than the partial pressure around the material to be modified surface. The partial pressure of the reaction gas within the vacuum chamber is $10^{-1}$ to $10^{-7}$ torr.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

MODES FOR CARRYING OUT THE PREFERRED EMBODIMENTS

The present invention is directed to an apparatus for surface modification using a low energy ion beam which is different from the known art which is directed to a thin film fabrication and to a surface cleaning. The present invention is directed to overcoming the limitations encountered in the techniques disclosed in Korean Patent applications 2456/1996, 11994/1996, 11995/1996 and 11996/1996.

When an ion beam generated from the ion source is irradiated over the surface of a polymer material while blowing a reaction gas thereover, namely, oxygen or nitrogen gas onto the surface, a hydrophobic surface can be changed into a hydrophilic surface. Also, in case of changing the roughness of the surface of a deposited metal thin film by irradiating an inert gases onto the surface simultaneously with depositing other thin films (nitride or oxide) on the surface by blowing a reaction gas onto the surface, the enhancement of the adhesive force between two thin films can be obtained.

Figure 1:
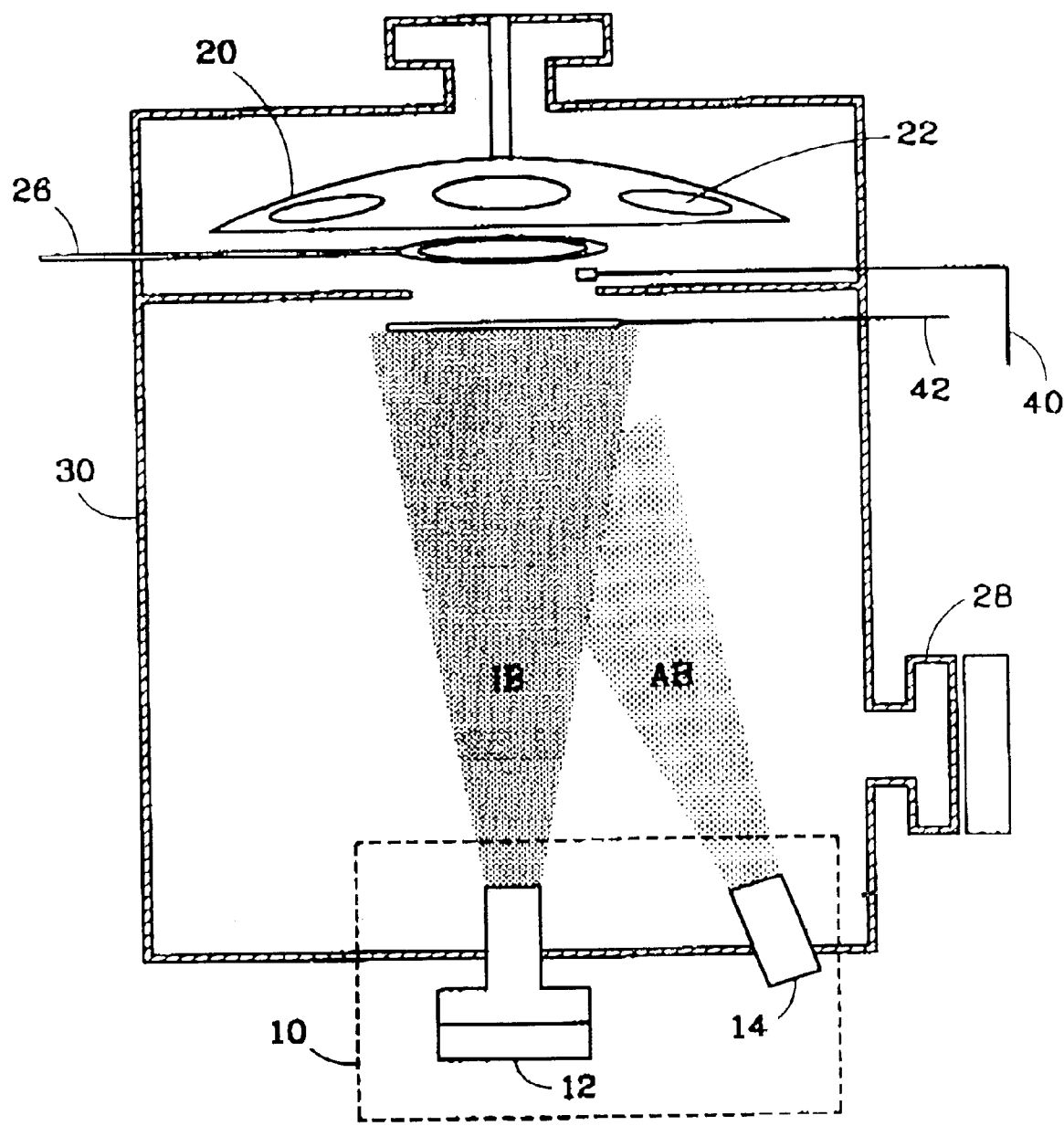
FIG. 1 is a schematic view illustrating an ion assisted reaction apparatus using a reaction gas in the known art.
Figure 2:
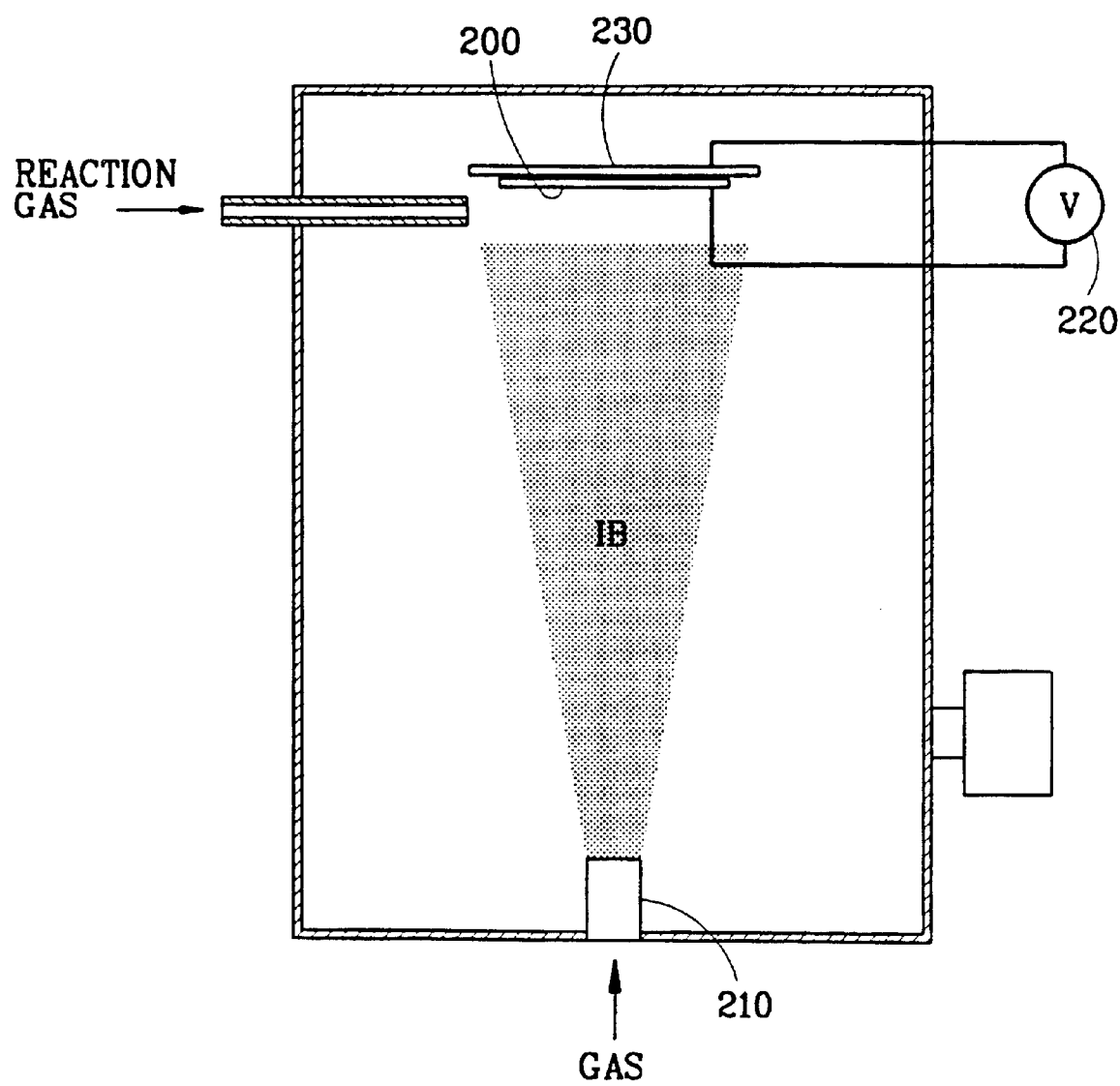
FIG. 2 is a schematic view illustrating an ion assisted reaction apparatus according to the present invention which is capable of applying a voltage to the surface of a material to be surface-modified.

FIG. 2 is a schematic view illustrating an ion-assisted reaction apparatus according to the present invention which is capable of applying a voltage (i.e., bias) to a material to be surface-modified. According to the first preferred embodiment of the present invention, when irradiating an ion beam onto the surface of a metallic thin film, oxide thin film or organic material 200 having curved surfaces, an attraction force or repulsion force between the ions from the ion gun 210 and the surfaces of the material is generated by applying a voltage from a voltage source 220 to the material to be surface-modified simultaneously while $Ar^+$ ions from the ion gun are accelerated, so that a charge distortion may be obtained to modify the composition and shape of the surface of the material. That is, according to the present invention, there is provided a holder 230 to which a voltage is applied, compared to the known art in which a voltage is not applied to the holder. Furthermore, according to the present invention, the holder 230 is electrically insulated from the vacuum chamber and positive or negative voltages are applied thereto.

Figure 3:
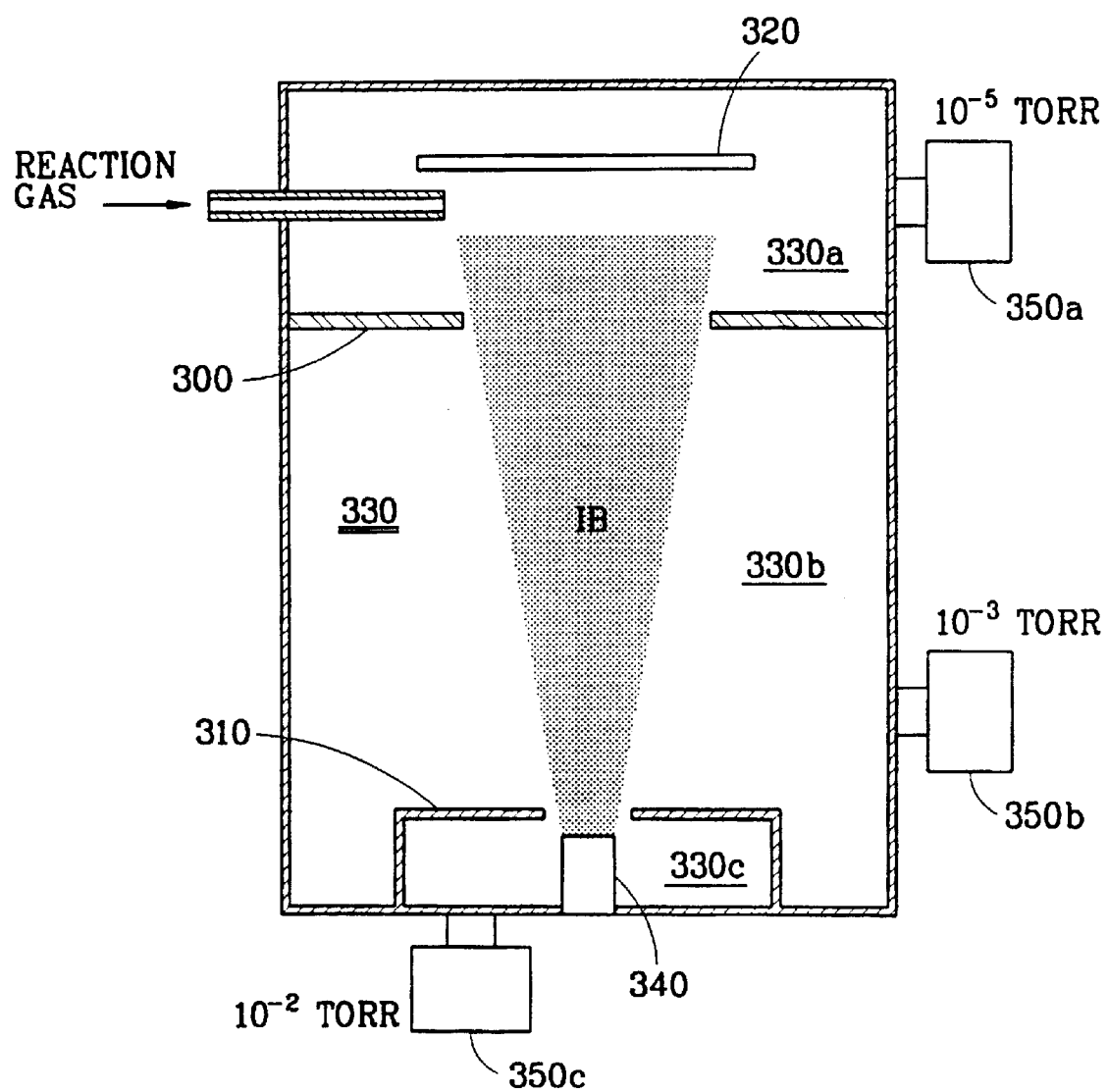
FIG. 3 is a schematic view illustrating an ion assisted reaction apparatus according to the present invention which is capable of controlling the partial pressure of a reaction gas.

FIG. 3 is a schematic view illustrating an ion beam apparatus which is capable of controlling a reaction gas partial pressure. In the known art, it is difficult to control the amount of the reaction gas because the reaction gas is blown over the surface of the material when supplying the reaction gas around the holder. However, as shown in FIG. 3, in the present invention, there are provided separating walls 300, 310 for separating the material 320 to be surface-modified from the ion gun 340 generating an ion beam IB for thereby easily controlling the partial pressure of the reaction gas around the material 320. The separating walls 300, 310 are installed within the chamber for the reason that when the reaction gas blown around the surface of the material 320 is introduced into the ion gun 340, the reaction gas may react with a filament hot-wire provided in the ion gun 340 thereby damaging the filament hot-wire by an oxidation or nitrification reaction therebetween. In addition, such reaction between the reaction gas and the filament hot-wire may prevent the formation of a plasma generated from the ion source. Namely, since the degree of the vacuum around the material is lower than that at the side of the ion source by $10^{-3}$, the reaction gas is not introduced toward the ion source side and is discharged to the outside. When forming the separating walls 300, 310 for thereby exposing only a predetermined region, it is possible to modify only a predetermined surface, so that the surface of the material 320 may be selectively modified, and it is possible to prevent the introduction of a foreign material which may cause the above-described problems. In addition, the partial pressure in the vacuum chamber 330 between the portion 330a around the material and the portions 330b or 330c around the ion source may be controlled by variously installing vacuum pumps 350a, 350b, 350c providing different degrees of vacuum.

Figure 4:
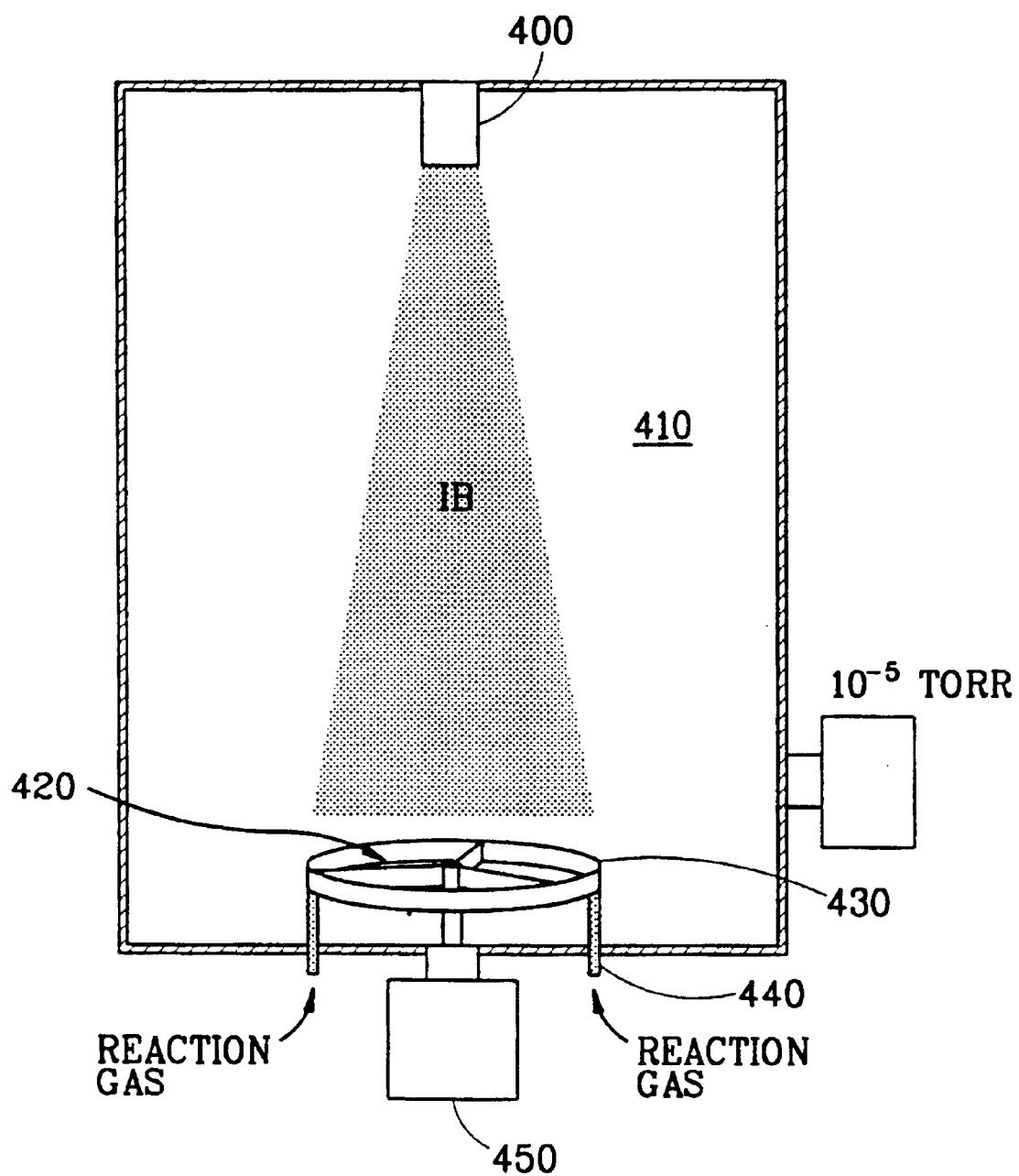
FIG. 4 is a schematic view illustrating an ion assisted reaction apparatus according to the present invention which is capable of implementing the modification of the surface of a powdered material.

FIG. 4 is a schematic view illustrating an ion-assisted reaction apparatus for modifying powdered materials according to the present invention. In the known art, the ion source is installed at a lower portion in the ion-assisted deposition apparatus, and a material to be deposited is placed thereabove, i.e., the target to be surface-modified is placed on the opposite side of the ion source as in the ion sputtering method. In this case, however, it is impossible to hold a material such as one consisting of fine particles or a non-uniformly shaped material. However, according to the present invention, a powdered material 420 may be surface-modified by installing the ion source 400 in an upper portion of the chamber 410 and agitating the powdered material 420. In order to modify the surfaces of the powder, a holder 430 is provided in the vacuum chamber 410 in order to hold the powdered material 420 to which an ion beam IB from the ion source 400 is irradiated and to agitate the powdered material 420 when driven by a motor 450. in the case of the blowing of the reaction gas, a gas blowing unit 440 for supply a reaction gas to the powdered material therethrough is installed around the powdered material 420 or in the holder 430, so that the amount of the reaction gas is controlled.

Figure 5:
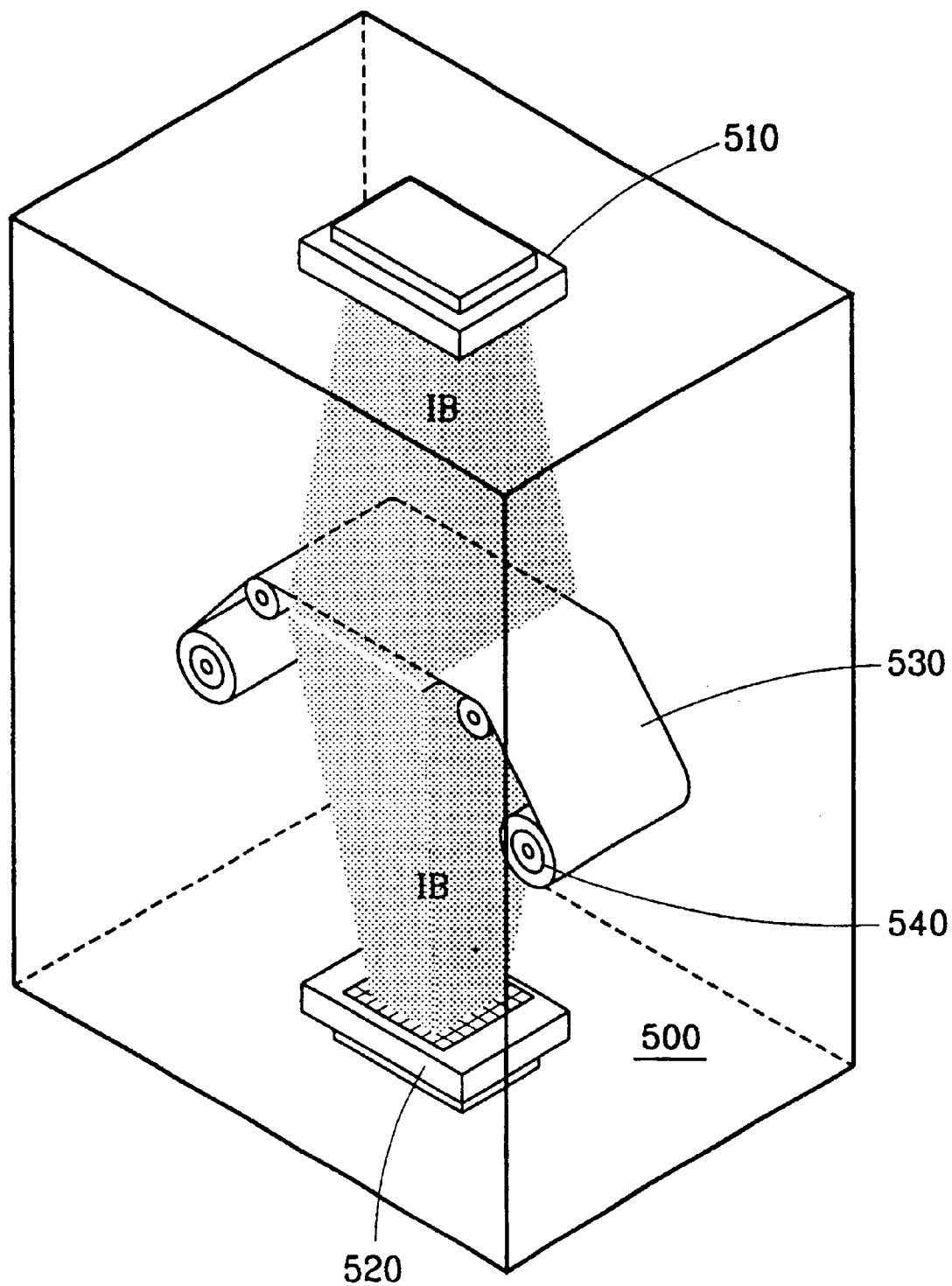
FIG. 5 is a schematic perspective view illustrating an ion assisted reaction apparatus according to the present invention which is capable of modifying more than one side of a material.

FIG. 5 is a schematic view illustrating an apparatus which is capable of modifying more than one side of a material. Namely, there is shown an apparatus which with respect to the position of an ion source, is capable of modifying the surfaces of a piece of cloth or the surfaces of a film. As shown therein, two or more ion sources 510, 520 are provided in an upper or lower portion of the chamber, or in at least two respectively opposing locations within the chamber 500 for generating respective ion beams IB and irradiating the ion beams respectively to front and/or back or respectively opposing surfaces of a material 530 to be surface-modified. Namely, it is possible to irradiate the ion beams at an angle of 45°, 60°, 90° to the surface-modified plane, so that variously shaped materials such as spherical materials, curved materials, etc. may be uniformly surface-modified.

Figure 6:
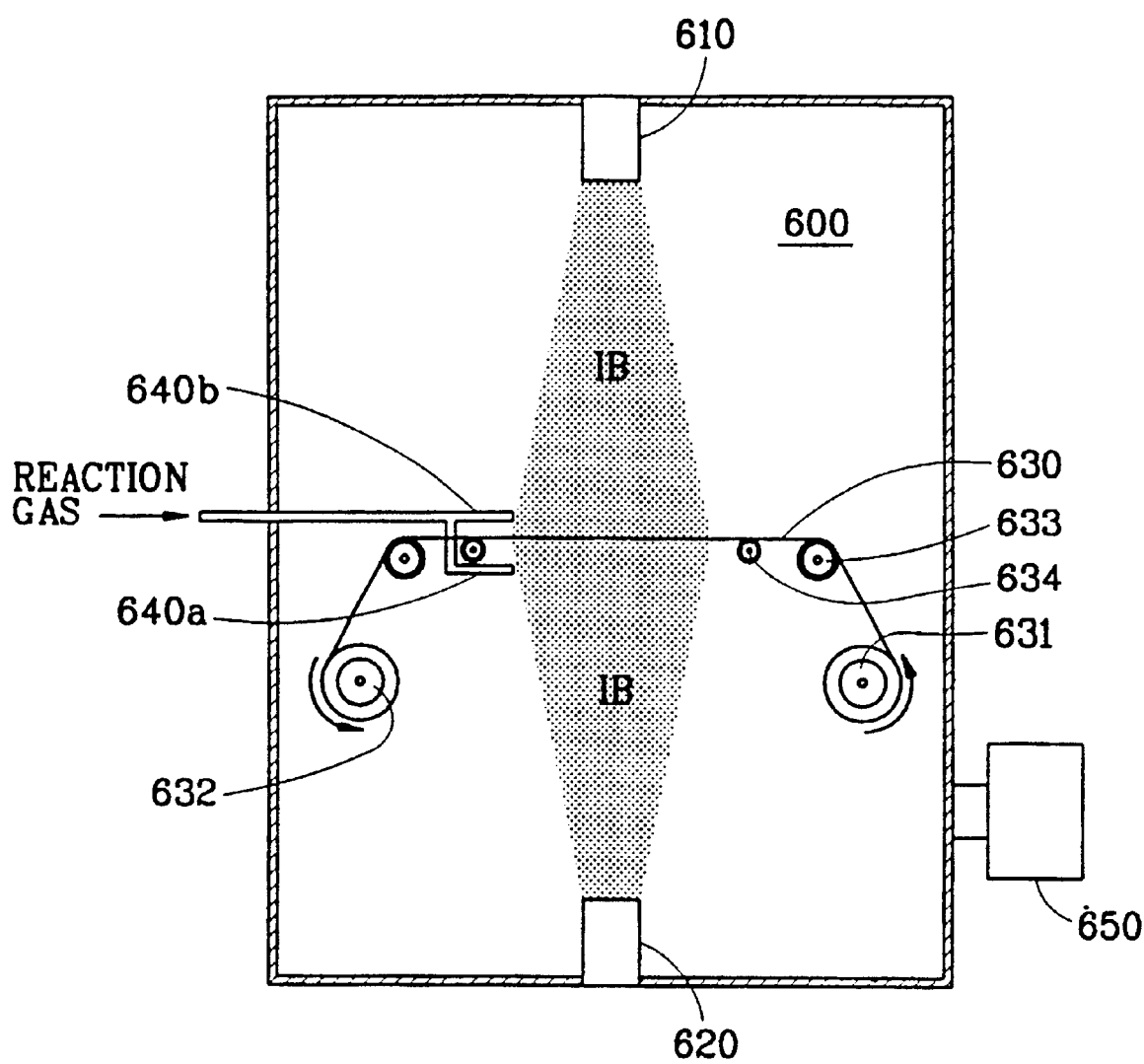
FIG. 6 is a schematic view illustrating an ion assisted reaction apparatus according to the present invention which is capable of implementing a batch type continuous process.

FIG. 6 is a view illustrating an ion beam modification apparatus which is capable of implementing a batch-type continuous process. Generally, the apparatus is designed to continuously process the surfaces of a film, foil or a sheet for the mass production. As shown therein, after forming a film or textile materials having a long length i.e., a web wound into a roll, a continuous surface modification is performed thereon. The above described continuous surface modification apparatus also has an advantage of being capable of controlling the speed of the film in order to control the degree of the surface modification, by installing a device for winding the film in a roll. The apparatus includes a chamber 600, a vacuum source 650 for maintaining a vacuum within the chamber, one or more ion sources 610, 620 each having an ion gun and provided in an upper or lower portion of the chamber 600, or in at least two respectively opposing locations within the chamber for generating respective ion beams and irradiating the ion beams respectively to front and/or back or opposing surfaces of a material 630 to be surface-modified, a rollers 631, 632, 633, 634 for supplying the material 630, and a reaction gas supply manifold 640a, 640b for supplying a reaction gas to respective surfaces of the material onto which the ion beams generated from the ion sources are irradiated, wherein the material 630 is continuously supplied to a reaction region in the chamber over which the ion beams are irradiated, and drawn off from the reaction region.

Figure 7:
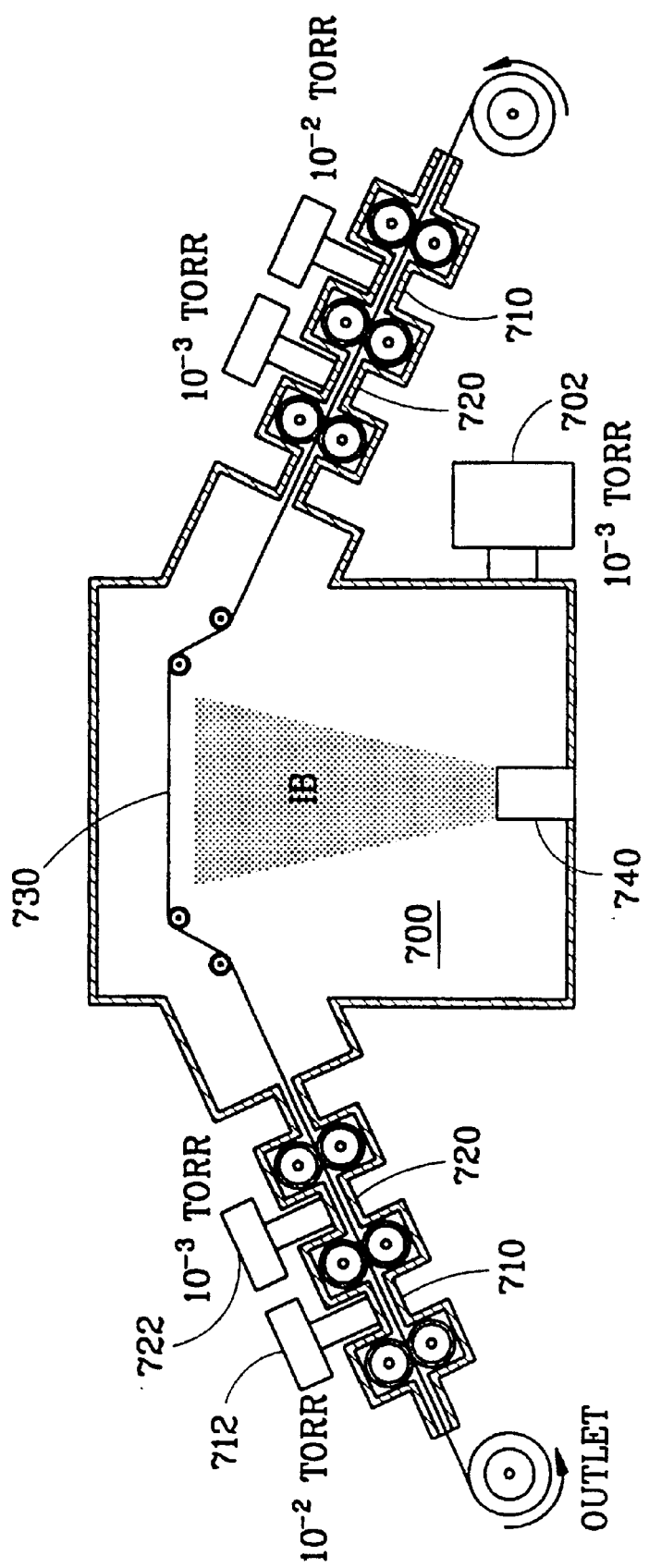
FIG. 7 is a schematic view illustrating an ion assisted reaction apparatus according to the present invention which is capable of continuously modifying a surface of a material by introducing the material from outside into a vacuum chamber.

FIG. 7 is a view illustrating an ion beam modification apparatus which is capable of continuously modifying a material introduced from the outside atmosphere into the vacuum atmosphere within the chamber. Generally, the ion source apparatus generating the ion beam produces a high quality of ion beam only if a high degree of vacuum is maintained in the chamber. In the first vacuum chamber 710 in which an initial vacuum is formed by a first vacuum pump 712, a low degree of a vacuum is obtained, and then a desired degree of vacuum is sequentially obtained in the sequential vacuum chamber 700 by another vacuum pump 702. Because the first vacuum chamber 712 in which is generated an initial vacuum is provided to form only an initial vacuum state, a vacuum chamber of large volume is unnecessary. If the initial vacuum state is not able to be desirably formed, there can be provided secondary or tertiary vacuum chambers 720 and secondary or tertiary vacuum pump 722. When the desired vacuum is formed, the material 730 is transferred into the reaction area in which the ion beam IB from the ion source 740 is irradiated and the surface modification is performed. In the case of drawing off the modified material, the material is drawn off via one or more chambers having a lower degree of vacuum in a reverse order in sequence of obtaining a desired vacuum state, and then the resultant material is stored in a desired manner.

Figure 8:
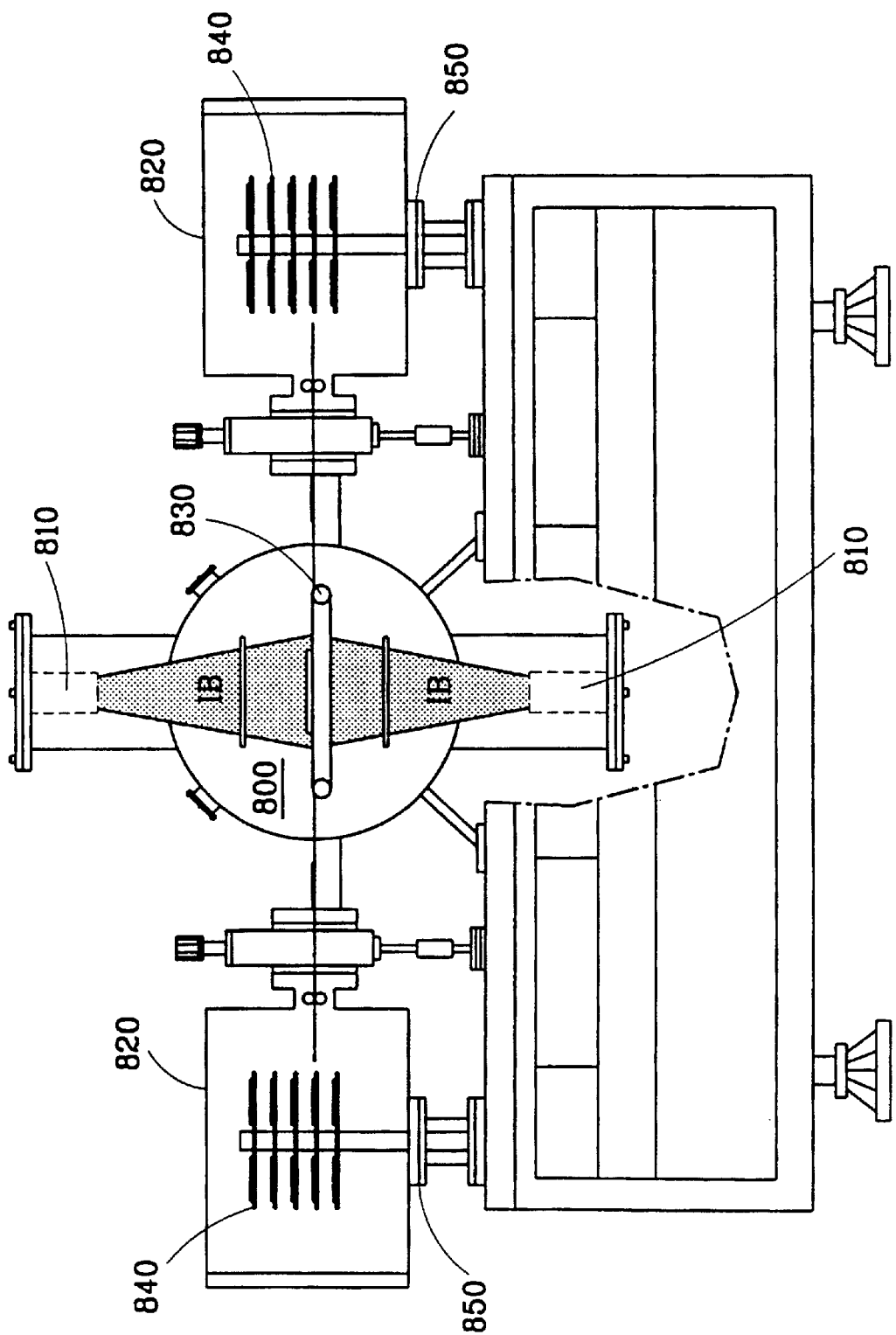
FIG. 8 is a schematic view illustrating an ion assisted reaction apparatus according to the present invention which is capable of continuously modifying the surface of a material which is provided in the form of a set of wafers.

FIG. 8 is a view illustrating an ion beam apparatus which is capable of continuously modifying a material which is provided in a set form such as in wafers, which can be used for forming an oxide material or for forming a material having mechanical strength. This apparatus can be used to modify surfaces with a plate shape, so it has useful applications such as for surface modification of silicon wafers, metal plates and ceramic thick films. In order to move the plate type materials, a container chamber 820 is attached at each side of an ion beam modification chamber and a belt type conveyor system 830 is extended cross the ion beam modification chamber. Firstly, a vertical movement rod supporting the holders 840 can move upwardly and downwardly for changing the round-type holders 840 which may contain a maximum of 6 articles (wafers, plates, etc.) at the same time. Secondly, each holder 840 is rotated and connected with the batch type conveyor system 830 for moving the articles into the ion beam modification chamber. A holder rotation system 850 is driven by a stepping motor which rotates with an angular rotation each 60°.

As described above, in the present invention, it is possible to enhance the characteristic of the surface of the material by controlling the amount of the reaction gas in the ion assisted reaction apparatus and the energy of the ion beam irradiated to the material to be modified with respect to its surface.

According to the present invention, it is possible to implement a surface irradiating method or a continuous batch process which may be applicable to an actual fabrication process.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. An apparatus for continuous surface modification of a material using an ion beam, comprising:

a chamber;

a vacuum means for maintaining a vacuum within the chamber;

two or more ion sources each having an ion gun and provided in an upper or lower portion of the chamber, or in at least two respective opposing locations within the chamber for generating respective ion beams and irradiating the ion beams respectively to front and/or back or opposing surfaces of a material to be surface-modified;

a means for supplying the material; and a reaction gas supplying means including a reaction gas inlet for supplying a reaction gas to respective surfaces of the material onto which the ion beam generated from the ion source is irradiated, wherein the material is continuously supplied to a reaction region in the chamber over which the ion beams are irradiated, and drawn off from the reaction region.

2. The apparatus according to claim 1, wherein two or more vacuum means are provided, and further comprising a separating means for separating a material reaction portion of the chamber in which the surface is modified when the reaction gas is supplied to the material surface, from a portion of the chamber in which the ion source is provided, wherein the vacuum level in the material reaction portion of the chamber is maintained to be higher than that in the portion of the chamber in which the ion source is provided.

3. The apparatus according to claim 1, wherein said material is wound in a roll, one end of said material being unrolled in one side of the chamber to be entered into the reaction region, and the part of the material entered into the reaction region is surface-modified by irradiating the ion beam thereon, and then the modified material is rolled up again in the other side of the chamber.

4. The apparatus according to claim 3, wherein said rolled material is received in the chamber.

5. The apparatus according to claim 3, wherein said rolled material is provided outside the chamber, and the material is unwound from outside of the chamber to the chamber having the reaction region, and the surface-modified material is drawn off outside the chamber and wound again in a roll.

6. The apparatus according to claim 5, wherein the degree of vacuum in the chamber is the highest in the reaction region when the to-be surface-modified material is supplied from the outside of the reaction chamber to the reaction region and the surface-modified material is drawn off to the outside of the chamber.

7. The apparatus according to claim 1, wherein said material is supplied and drawn off in wafers.

8. The apparatus according to claim 7, wherein the degree of vacuum in the chamber is the highest in the reaction region when the material to be surface-modified is supplied from the outside of the reaction chamber to the reaction region and the surface-modified material is drawn off to the outside of the chamber.

* * * * *